United States Patent
Booth, Jr. et al.

(10) Patent No.: US 7,005,799 B2
(45) Date of Patent: Feb. 28, 2006

(54) SEALING ORGANIC LIGHT EMITTING DEVICE DISPLAYS

(75) Inventors: Lawrence A. Booth, Jr., Phoenix, AZ (US); Robert C. Sundahl, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 09/918,404

(22) Filed: Jul. 30, 2001

(65) Prior Publication Data

US 2003/0020398 A1    Jan. 30, 2003

(51) Int. Cl.
*H01J 1/62* (2006.01)
*H01J 63/04* (2006.01)

(52) U.S. Cl. .................... 313/512; 313/506
(58) Field of Classification Search ............ 313/504, 313/506, 502, 512, 509; 445/25
See application file for complete search history.

(56) References Cited

U.S. PATENT DOCUMENTS

| | | | |
|---|---|---|---|
| 4,357,557 A * | 11/1982 | Inohara et al. ............. 313/509 |
| 4,810,931 A * | 3/1989 | McKenna et al. ........... 313/509 |
| 5,427,858 A * | 6/1995 | Nakamura et al. .......... 428/421 |
| 5,632,663 A * | 5/1997 | Ishihara et al. ............. 445/25 |
| 5,661,371 A * | 8/1997 | Salerno et al. ........... 315/169.3 |
| 5,962,962 A * | 10/1999 | Fujita et al. ................. 313/412 |
| 5,990,615 A * | 11/1999 | Sakaguchi et al. .......... 313/504 |
| 6,339,289 B1 * | 1/2002 | Fork ........................... 313/506 |
| 6,448,710 B1 * | 9/2002 | Asai et al. ................... 313/504 |
| 6,470,594 B1 * | 10/2002 | Boroson et al. ............... 34/335 |
| 6,489,719 B1 * | 12/2002 | Young et al. ................ 313/512 |
| 6,498,428 B1 * | 12/2002 | Matsuura et al. ........... 313/506 |
| 6,635,989 B1 * | 10/2003 | Nilsson et al. .............. 313/512 |
| 6,641,933 B1 * | 11/2003 | Yamazaki et al. ........... 428/690 |

* cited by examiner

*Primary Examiner*—Joseph Williams
*Assistant Examiner*—Peter Macchiarolo
(74) *Attorney, Agent, or Firm*—Trop, Pruner & Hu, P.C.

(57) ABSTRACT

An organic light emitting device display may be formed of at least two moisture impervious layers sealed to one another using an epoxy material having a desiccant formed within the epoxy material. Any moisture or other solvents that tend to penetrate into the region between the front and back plates of the display where the organic light emitting material resides, will be trapped by the desiccant within the filler material.

20 Claims, 1 Drawing Sheet

SEALING ORGANIC LIGHT EMITTING DEVICE DISPLAYS

BACKGROUND

This invention relates generally to organic light emitting device (OLED) displays.

Organic light emitting devices use an organic or material that emits light. One type of OLED material is a polymer material. These devices are useful in displays for electronic devices. An organic material that is light emissive may be sandwiched between row and column electrodes. When a potential is applied to the light emitting material, it emits light of a particular wavelength. The emitted light passes through the column electrode that may be transparent in some embodiments. Organic light emitting devices offer the potential for relatively low cost displays made from organic light emitting material.

One problem with organic light emitting materials is that they are relatively sensitive to moisture, oxygen and common solvents. Thus, even during the manufacturing process, the organic light emitting materials may be attacked by moisture and oxygen in the surrounding atmosphere and solvents used in the remaining portions of the manufacturing process.

The organic light emitting materials are not totally compatible with conventional passivation materials. Common passivation materials are inorganic materials such as silicon nitride, phosphosilicate glass and silicon carbide. Still another problem is that many of these common passivation materials require deposition temperatures that exceed the temperatures at which organic light emitting materials may be properly processed.

Thus, there is a need for better ways to prevent organic light emitting materials from being contaminated.

DETAILED DESCRIPTION

Figure 1:
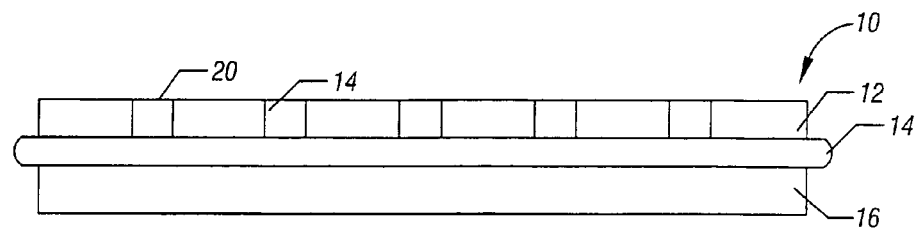
FIG. 1 is a side elevational view of one embodiment of the present invention.

Referring to FIG. 1, an organic light emitting device (OLED) display may include a back plate 16 secured to a front plate 12. In one embodiment, the organic light emitting material is secured to the interior side of a transparent front plate 12. A filler material 14 may be applied between the front and back plates 12 and 16. The material 14 may include a standard epoxy utilized for device assembly back fill processes in one embodiment. A desiccant compound, such as silica or zeolite material, may be mixed into the filler material 14.

The back plate 16 may be a glass or ceramic layer that is impervious to the ambient including moisture. An adequate offset of the front panel 12 from the edges provides the necessary diffusion distance to achieve an acceptable lifetime.

Figure 2:
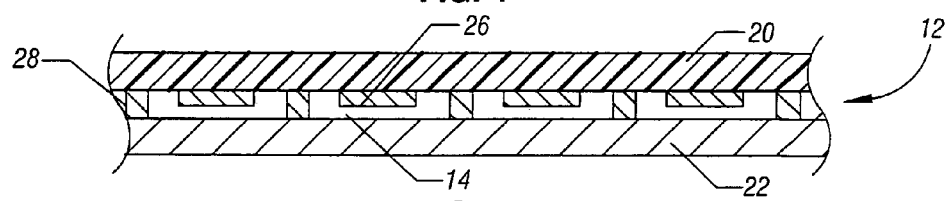
FIG. 2 is a partial, enlarged cross-sectional view of the module shown in FIG. 1, taken generally along the line 2—2 in FIG. 3 in one embodiment of the present invention.

Referring to FIG. 2, in accordance with one embodiment, each of the front plates 12 may be a module including a transparent substrate 20 surface mounted by surface mount material 28 to a back plate 22. In one embodiment, the back plate 22 may be a ceramic plate. The back plate 22 may receive integrated circuit driver devices and may transmit the signals from the driver devices (not shown) through the solder balls 28 to row and column electrodes (not shown) deposited over the substrate 20. Organic light emitting material may be deposited on the substrate 20 on the rear side thereof as indicated at 26. Light emitted by the light emitting material passes outwardly through the front plate 20. The region remaining between the front plate 20 and the rear plate 22 may be filled with the material 14.

Figure 4:
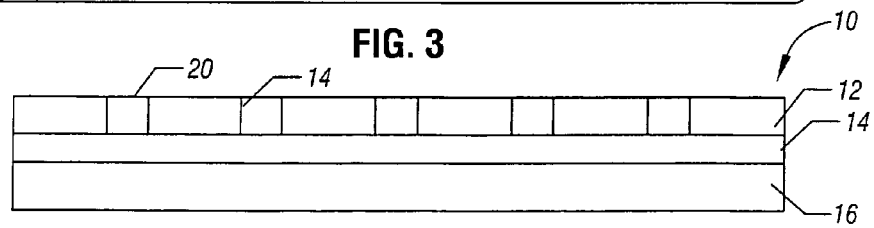
FIG. 4 is a side elevational view of another embodiment.

As shown in FIG. 4, in an implementation for array displays, such offsets may not be acceptable. The OLED structure may extend to the end of the display module array displays. Additional protection can be achieved through the use of the filler material 14 to fill the seams between neighboring modules of array displays.

Figure 3:
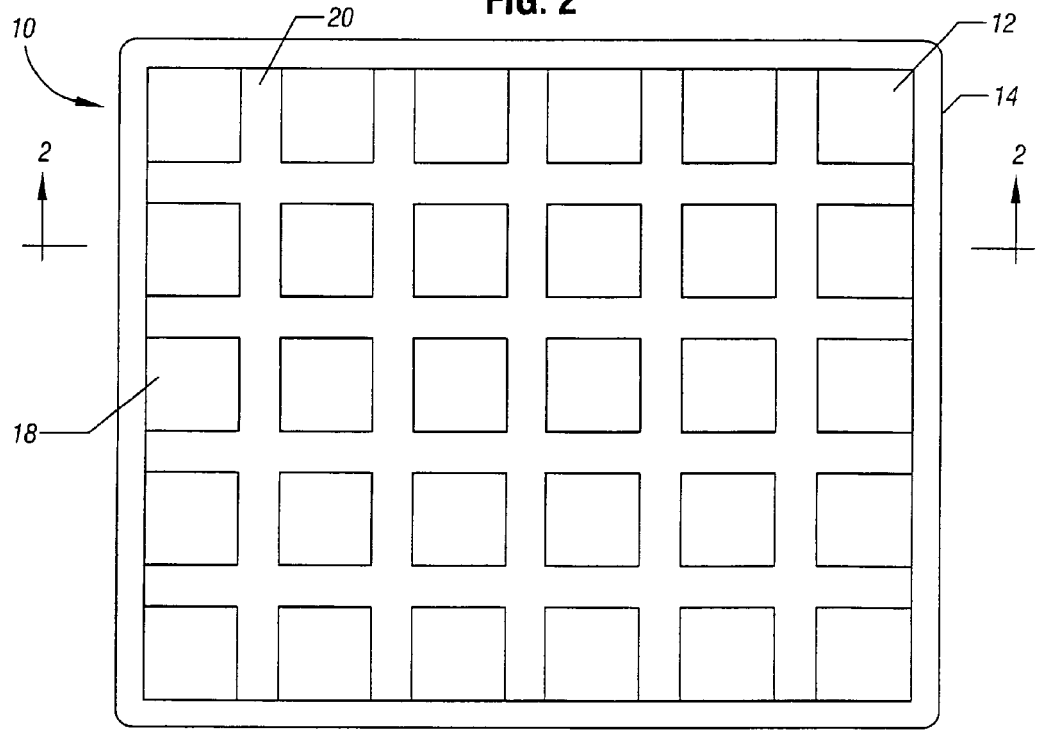
FIG. 3 is a top plan view of the embodiment shown in FIG. 1.

As shown in FIG. 3, a plurality of modules 18 may be abutted side-to-side, each module 18 abutting the lateral extension of the filler material 14 and sealing the joints within any given array display 10 and between adjacent modules 18.

The desiccant in the filler material 14 traps moisture before it can attack the moisture sensitive organic light emitting materials in the OLED display 10. In addition, the moisture trapping capability is provided between the layers 20 and 22 of each module 18. The desiccant or getter material absorbs moisture and other gases as they diffuse in from the edge of the sandwiched display 10.

Thus, each module 18 may be surrounded by a barrier of desiccant filler material 14 and the front and back plates 12 and 16 may be similarly coated.

In some embodiments, instead of using two layers 12 and 16, a single layer may be utilized. In such case, the single layer may be adhesively secured to a container or can by an adhesive that includes the desiccant material. In a single layer structure, the passivation may be bonded to the can. In still another embodiment, a structure, such as that shown in FIGS. 1 and 2, may be secured to a container such as a can by an adhesive that includes a desiccant.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An organic light emitting display comprising:
   a plurality of modules, each including a front plate and a back plate;
   an organic light emitting material formed on one side of said front plate, said organic light emitting material to pass light outwardly through said front plate;
   said back plate secured over said one side of said front plate; and
   a filler material including a desiccant mixed into said filler material to seal the region between said front and back plates and a region between adjacent modules.

2. The display of claim 1 wherein said desiccant is a silica.

3. The display of claim 1 wherein said desiccant is zeolite.

4. The display of claim 1 wherein said filler material includes epoxy.

5. The display of claim 1 including surface mounting said front plate to said back plate using solder balls.

6. The display of claim 1 wherein said plurality of modules forms an array.

7. The display of claim 6 including a carrier, said array adhesively secured to said carrier with a filler material including a desiccant mixed into the filler material.

8. The display of claim 7 wherein said filler material including desiccant that is between said array and said carrier forms and extension beyond the periphery of the carrier.

9. A method comprising:
   forming a front plate having an organic light emitting material deposited thereon;
   covering said organic light emitting material with a back plate;
   combining a plurality of light emitting device modules to form an array; and
   filling the regions between the front and back plates and adjacent modules with a filler material including a desiccant mixed into said filler material, said filler material including desiccant to surround each module.

10. The method of claim 9 including mixing a filler material into an epoxy.

11. The method of claim 9 including mixing zeolite into epoxy to form said filler material.

12. The method of claim 9 including mixing silica into epoxy to form said filler material.

13. The method of claim 9 wherein covering said organic light emitting material with a back plate includes surface mounting said front plate to said back plate.

14. The method of claim 9 wherein forming a front plate includes forming a transparent front plate to pass light emitted from said organic light emitting material outwardly through said front plate.

15. The method of claim 9 including securing said array of modules to a carrier with a filler material including a desiccant mixed into the filler material.

16. The method of claim 15 including forming a lip of said filler material including desiccant that extends beyond the periphery of said array of modules and said carrier.

17. An organic light emitting display comprising:
   a plurality of modules, each module including a front plate and back plate parallel to the front plate;
   an organic light emitting material formed on one side of the front plate; and
   a filler material including a desiccant mixed into the filler material to secure the back plate over the one side of the front plate, and to seal the region between the front and back plates and the region between adjacent modules.

18. The display of claim 17 including a carrier secured to said plurality of modules by the filler material.

19. The display of claim 18 including an extension of filler material around the display.

20. The display of claim 17 wherein the modules on the periphery of said display extend to the end of said display.

* * * * *